United States Patent
Restaino et al.

(10) Patent No.: US 6,638,878 B2
(45) Date of Patent: Oct. 28, 2003

(54) FILM PLANARIZATION FOR LOW-K POLYMERS USED IN SEMICONDUCTOR STRUCTURES

(75) Inventors: Darryl D. Restaino, Modena, NY (US); Jeffrey C. Hedrick, Montvale, NJ (US); John A. Fitzsimmons, Poughkeepsie, NY (US); Christy S. Tyberg, Croton-on-Hudson, NY (US); Chih-Chien Liu, Fishkill, NY (US); Shahab Siddiqui, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 09/969,361

(22) Filed: Oct. 2, 2001

(65) Prior Publication Data
US 2003/0064605 A1 Apr. 3, 2003

(51) Int. Cl.[7] ............... H01L 21/461; H01L 21/31
(52) U.S. Cl. .............. 438/782; 438/654; 438/644; 438/628; 427/372.2; 257/783
(58) Field of Search .............. 156/60; 257/783; 438/644, 654, 118, 778–794, 628; 427/207.1, 208.2, 372.2; 428/40.1, 42.3

(56) References Cited

U.S. PATENT DOCUMENTS

| | | | |
|---|---|---|---|
| 4,988,413 A | * | 1/1991 | Chakravorty et al. ........ 204/15 |
| 5,965,679 A | * | 10/1999 | Godschalx et al. ......... 526/281 |
| 6,071,806 A | | 6/2000 | Wu et al. |
| 6,150,073 A | | 11/2000 | Huang |
| 6,156,374 A | | 12/2000 | Forbes et al. |
| 6,159,845 A | | 12/2000 | Yew et al. |
| 6,187,661 B1 | | 2/2001 | Lou |
| 6,437,425 B1 | * | 8/2002 | Chakrabarti et al. ........ 257/643 |

OTHER PUBLICATIONS

E.O. Shaffer II, "Fracture Mechanics of Thin Film Dielectrics," Sep. 2000.
E.O. Shaffer II, K.E. Howard, M.E. Mills, and P.H. Townsend, "On the Mechanical Integrity of Ultra–Low Dielectric Constant Materials for Use in BEOL Structures," Apr. 25, 2000, pp. 1–24.
"SiLK* Semiconductor Dielectric Resins: The SiLK Story," The Dow Chemical Company 1995–2000, http://www.dow.com.
"SiLK* Semiconductor Dielectric Resins: Products—Product Families" The Dow Chemical Company 1995–2000, http://www.dow.com/silk/products/index.htm.

(List continued on next page.)

Primary Examiner—Matthew Smith
Assistant Examiner—Calvin Lee
(74) Attorney, Agent, or Firm—James J. Cioffi; Cantor Colburn LLP

(57) ABSTRACT

A method for forming a planarized dielectric layer upon a semiconductor wafer is disclosed. In an exemplary embodiment of the invention, the method includes applying an adhesion promoter to the wafer, thereby forming an adhesion promoter layer. A dielectric material is applied in a spin-on fashion upon the adhesion promoter layer at a relative humidity of less than 40% and for a thickness setting duration of less than 30 seconds. Then, the dielectric material is dried by baking without additional spinning of the semiconductor wafer.

18 Claims, 4 Drawing Sheets

OTHER PUBLICATIONS

"SiLK* Semiconductor Dielectric Resins: Products—SiLK I Semiconductor Dielectric" The Dow Chemical Company 1995–2000, http://www.dow.com/silk/products/silki.htm.
SiLK* I Semiconductor Dielectric, Dow Chemical Company.
Material Safety Data Sheet for XU 35114 Series of Developmental SiLK* I Semiconductor Dielectrics, pp. 1–9.
SiLK H Semiconductor Dielectric, Dow Chemical Company.
Material Safety Data Sheet for XU 35116 Series of Developmental SiLK* H Semiconductor Dielectrics, pp. 1–9.
AP4000 Adhesion Promoter, Dow Chemical Company.
Material Safety Data Sheet for XU 35117.00 Developmental Adhesion Promoter AP4000, pp. 1–8.

* cited by examiner

FILM PLANARIZATION FOR LOW-K POLYMERS USED IN SEMICONDUCTOR STRUCTURES

BACKGROUND

The present invention relates generally to semiconductor device processing and, more particularly, to improving the planarization of organic polymers used as low-k dielectrics in semiconductor structures.

In the fabrication of integrated circuit devices, it is often desirable to isolate individual components of the integrated circuits from one another with insulative materials. Such insulative materials may include, for example, silicon dioxide, silicon nitride and silicon carbide. While these materials may have acceptable insulating properties in many applications, they also have relatively high dielectric constants, which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance. Thus, for specific applications, insulating materials having relatively low dielectric constants (e.g., κ<3) are desired.

Certain organic polymers are known in the semiconductor manufacturing industry for their "low-k" dielectric properties, which polymers are often used for intermetallic insulation in damascene structures. An example of one such polymer is SiLK®, manufactured by The Dow Chemical Company. SiLK® is typically applied to semiconductor wafers by spin-on coating in a wafer track, similar to the process used in the application of photolithography resist. Initially in liquid form during the spin-on coating, the SiLK® material dries relatively quickly after the coating, thereby creating peaks and valleys of topography as it blankets device features having distinct step heights.

BRIEF SUMMARY

The following discussed drawbacks and deficiencies of the prior art are overcome or alleviated by a method for forming a planarized dielectric layer upon a semiconductor wafer. In an exemplary embodiment of the invention, the method includes applying an adhesion promoter to the wafer, thereby forming an adhesion promoter layer. A dielectric material is applied in a spin-on fashion upon the adhesion promoter layer at a relative humidity of less than 40% and for a thickness setting duration of less than 30 seconds. Then, the dielectric material is dried by baking without additional spinning of the semiconductor wafer.

In a preferred embodiment, the thickness setting duration is about 12 to about 16 seconds and the dielectric material is applied at a relative humidity of less than 35%. Following the drying of the dielectric material, any dielectric edge beads formed upon the semiconductor wafer are removed by applying a solvent thereto. The dielectric material is then cured by baking at about 400° C. The adhesion promoter layer is also cured, prior to applying the dielectric material by baking at about 185° C.

BRIEF DESCRIPTION OF THE DRAWINGS

Referring to the exemplary drawings wherein like elements are numbered alike in the several Figures.

DETAILED DESCRIPTION

Figure 1:
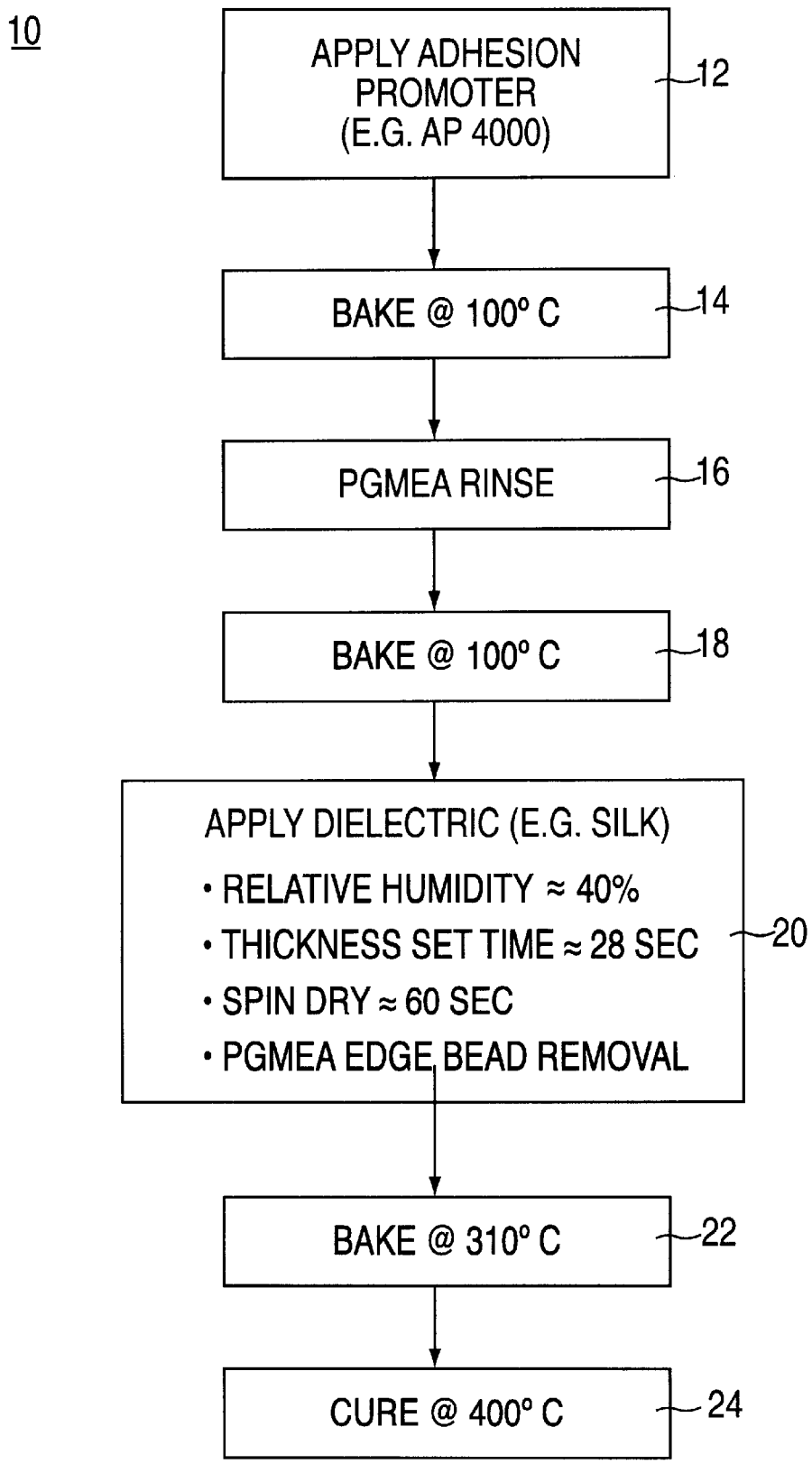
FIG. 1 is a flow diagram of an existing process for forming a dielectric polymer layer upon a semiconductor wafer.

Referring initially to FIG. 1, there is shown a flow diagram which illustrates an existing process 10 for forming a dielectric polymer layer upon a semiconductor wafer. Process 10 begins at block 12, where an adhesion promoter is applied before the spin-on application of the SiLK® polymer. One example of such an adhesion promoter is AP4000, also manufactured by The Dow Chemical Company, and is used in conjunction with the SiLK® products. In the conventional application of the AP4000 promoter, an initial promoter layer having a thickness of about 10–100 Å is spun on a wafer surface to be covered with the dielectric. At block 14, the wafer with the adhesion promoter thereon is then baked at about 100° C. in order to remove any residual solvent used in conjunction with the promoter. Next, at block 16, the initial promoter layer is reduced to a final monolayer (with a thickness of only about 5 to 10 Å) by rinsing in propylene glycol monomethyl ether acetate (PGMEA). At block 18, after baking again at about 100° C., the residual PGMEA is removed as the monolayer is prepared for the application of the SiLK® layer thereupon.

As illustrated in block 20, the polymer layer (e.g., a commercially available formulation of SiLKI 550, designed for a spin coat thickness of about 5,000 to 7,000 Å at a spin rate of about 2,000 to 4,000 rpm) is applied to the monolayer. In a conventional application, the relative humidity of the coater bowl is about 40% at an ambient temperature of about 18–25° C. Upon initial application of the dielectric polymer to the wafer, the duration of the spin-on coating process lasts for about 28 seconds in order to create a desired film thickness. Afterward, the polymer layer is subject to a drying spin cycle for about 60 seconds in order to remove excess solvent from the center and main body of the wafer. Then, any edge beading (of SiLK® polymer material formed at the outer portions of the wafer) is removed by a PGMEA rinse. Once the edge beads are removed, a hot plate bake at about 310° C. removes any remaining solvents, as shown in block 22. Finally, the existing process 10 proceeds to block 24 where the dielectric polymer layer is cured at about 400° C.

It has recently been discovered, however, that the planarization of applied SiLK® dielectric material is generally poor, with the application thereof often resulting in layer thicknesses which can exceed 10 times the height of a covered structure. This turns out to be the case even for relatively smooth topographies (e.g., having step heights as low as 200 angstroms) generated by damascene back-end-of-the-line (BEOL) processes. Thus, the resulting film thickness of the dielectric layer may potentially range from about 2000–8000 angstroms (Å). Given that a desired thickness value of SiLK® dielectric films is about 5000 Å, this degree of non-planarization becomes problematic.

It has further been discovered that the spin-on application of the SiLK® dielectric polymer, as currently known, produces a two-fold problem with respect to planarization of a dielectric layer. First, a lateral wave shifting occurs during the spin-on as a result of: (1) the centrifugal force exerted upon the applied coating as the wafer is spun; and (2) the rate of the drying time of the polymer itself. Second, there is a marked increase in the height of the applied dielectric layer wherever a step height exists in the underlying wafer structure. This is illustrated by reference to FIG. 2.

Figure 2:
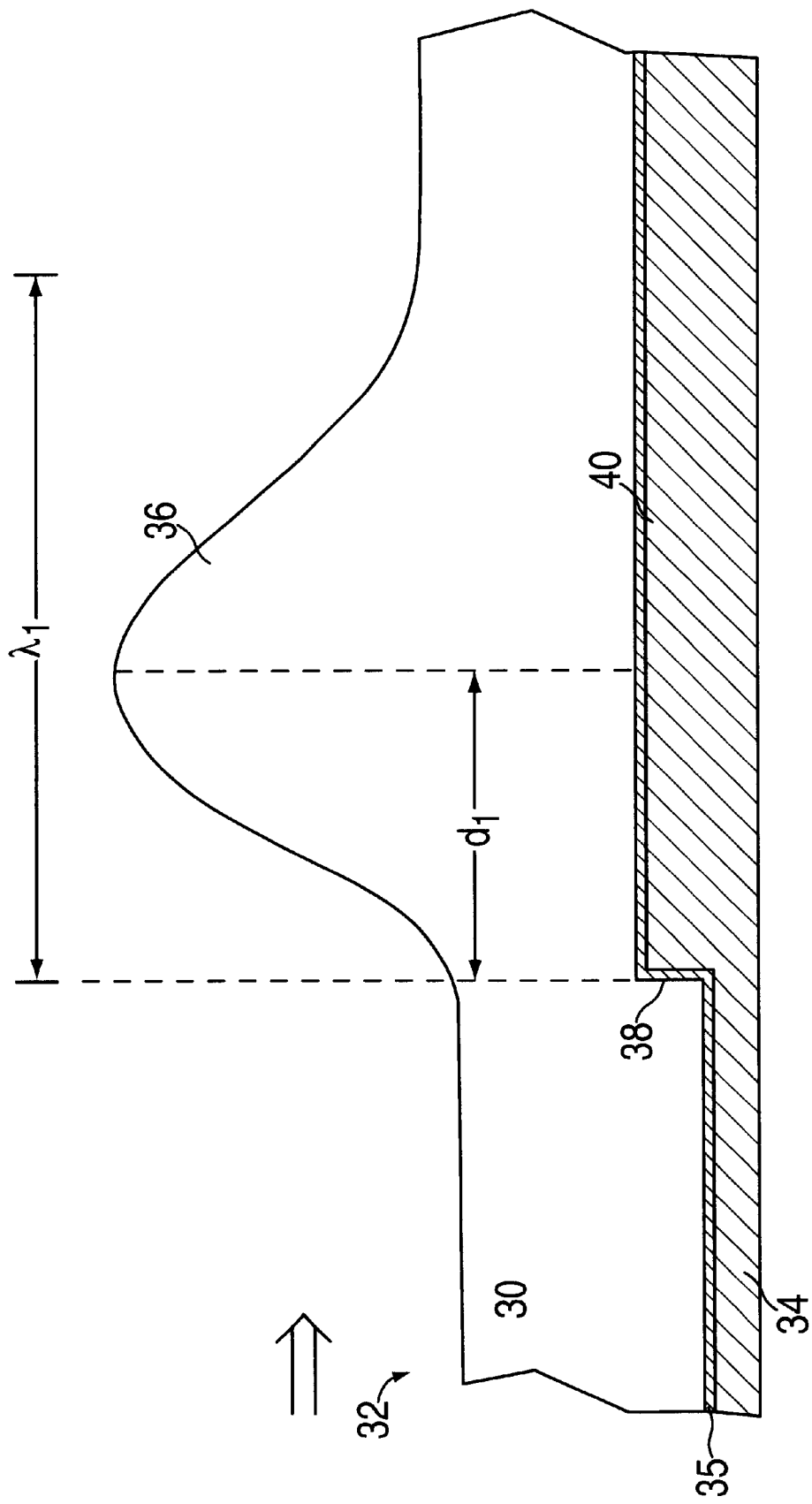
FIG. 2 is a cross-sectional view of an existing dielectric polymer layer, applied in accordance with the process in FIG. 1.

In FIG. 2, there is shown a cross-sectional view of a SiLK® dielectric polymer 30, applied to a section of a semiconductor wafer 32 in the manner described above. As can be seen, the centrifugal spinning of the wafer 32 results in the distribution of the SiLK® polymer 30 across the surface 34 of the wafer 32 (including adhesion promoter layer 35), traveling from the center of the wafer 32 to the outer edge of the wafer 32 (the direction of travel being indicated by the arrow). During the outward propagation of the SiLK® material, a polymer wave 36 is created as a result of the impact between the outwardly flowing SiLK® material and the step surface 38 on wafer 32 due to the presence of a layer 40 formed on wafer 32. In the example shown, the step height of surface 38 is on the order of about 100 Å to about 1,000 Å.

The resulting wave 36 may have a wavelength $\lambda_1$ of about 50–200 µm. However, the wider the wavelength of wave 36, the more detrimental is the effect on surface planarity. In addition, the peak of the wave 36 is also laterally displaced a distance $d_1$ from the step surface 38. This phenomenon of wavelength widening and displacement is also referred to hereinafter as "lateral shifting".

One way to reduce the effects of lateral shifting is to avoid overly long spin times such the the wave 36 does not have the opportunity to shift unevenly across the structures on the wafer. On the other hand, the spin time should be sufficiently long in order to stabilize film thickness. The applied film thickness, in turn, depends upon the particular spin rotation and specific grade of the SiLK® used. Since the drying time of the polymer 30 also affects lateral shifting, the stretching or shifting of the wave 36 may be controlled by altering the drying time thereof. Specifically, experiments have confirmed that the faster drying of the SiLK® polymer 30 reduces lateral shifting. The commercially available formulation of SiLK I 550, as conventionally applied, dries too slowly to prevent undesired lateral image shifting. It has been found, however, that by reducing the coater bowl humidity setpoint, the solvents used in conjunction with the polymer 30 evaporate more quickly, thereby enabling the film to dry more quickly. Furthermore, excessive lateral shifting may also be alleviated by reducing the need for high-speed spinning steps.

Figure 3:
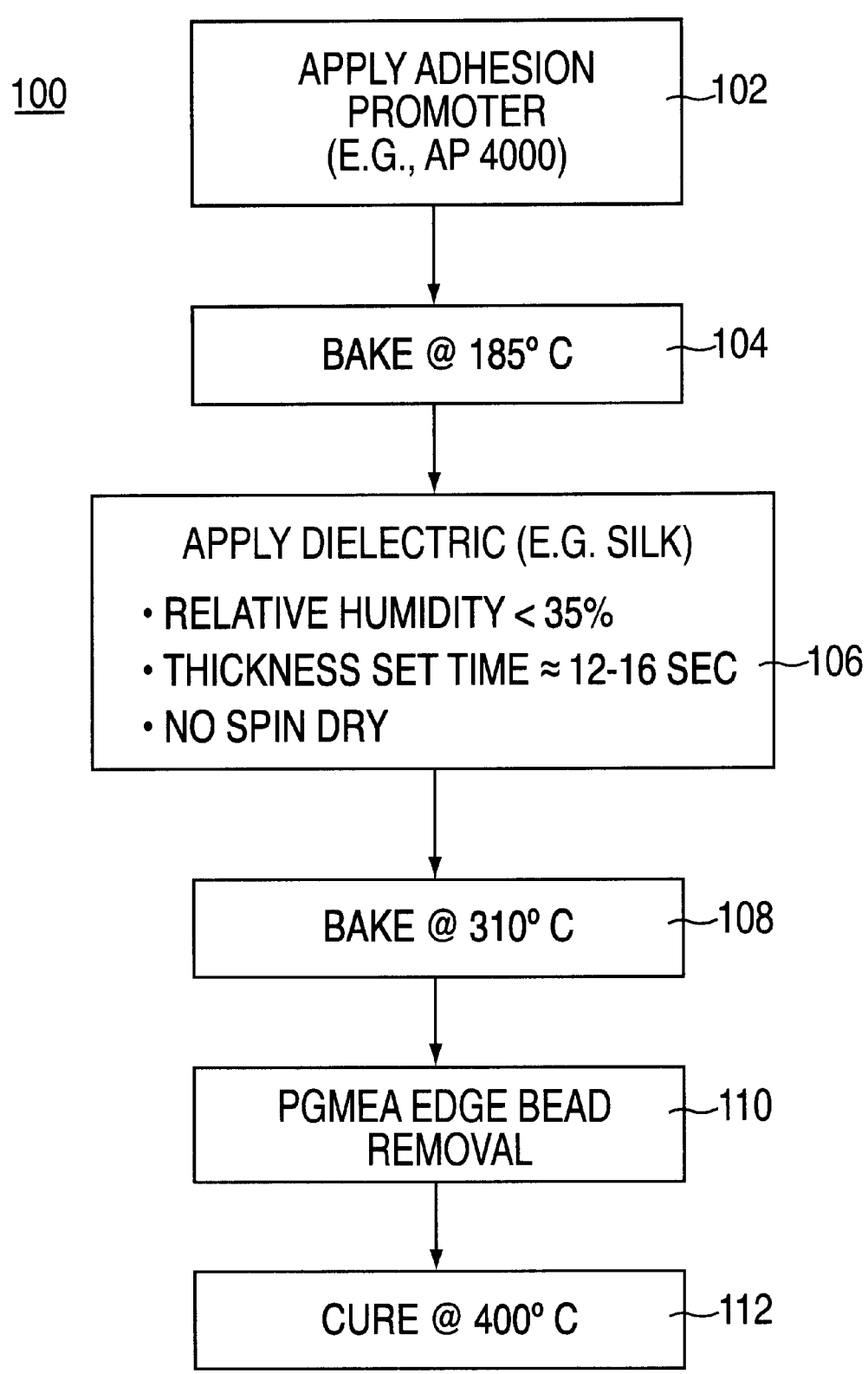
FIG. 3 is a flow diagram of a method for forming a dielectric polymer layer with improved planarity characteristics, in accordance with an embodiment of the invention.

Therefore, in accordance with an embodiment of the invention, FIG. 3 illustrates a method 100 for forming a planarized dielectric layer upon a semiconductor wafer. Method 100 begins at block 102 with the application of an adhesion promoter, preferably AP4000, to form an adhesion promoter layer of about 30 Å to about 90 Å in thickness. Then, at block 104, the adhesion promoter layer is subjected to a hotplate bake at about 185° C. in order for curing thereof. It will be noted that, in contrast to existing process 10, method 100 does not employ a PGMEA rinsing step in order to reduce the adhesion promoter layer to a monolayer. Rather, a promoter layer with an increased thickness helps to reduce the amplitude of the polymer wave 36.

The SiLK® dielectric material is then applied at block 106. In order to improve planarity, as discussed above, the relative humidity of the coater bowl is set below about 40%, and preferably below about 35% so that the solvents associated therewith may evaporate more quickly. Furthermore, the duration of the spin-on coating process is set to about 12 to about 16 seconds, thereby reducing the opportunity for the SiLK® material to shift unevenly across structures on the wafer. It will be noted at this point that the additional step of a high-speed spin dry is eliminated. In doing so, the lateral shifting is reduced. Then, to remove any remaining solvent, method 100 then proceeds to block 108 for an integrated hotplate bake at about 310° C. It will also be noted that an edgebead removal has not yet taken place, because the hotplate bake performs the solvent drying in lieu of a spin dry step.

Once the solvents are dried at block 108, method 100 then proceeds to a PGMEA edge bead removal at block 110. Because the remaining areas of the wafer have been dried, however, the application of PGMEA to the edge beads is done in a targeted manner. In other words, the PGMEA is applied only at the outer areas of the wafer where the edge beads have formed. Thus, this edge bead removal process produces crisp edge removal. Finally, at block 112, the wafer is cured at about 400° C.

Figure 4:
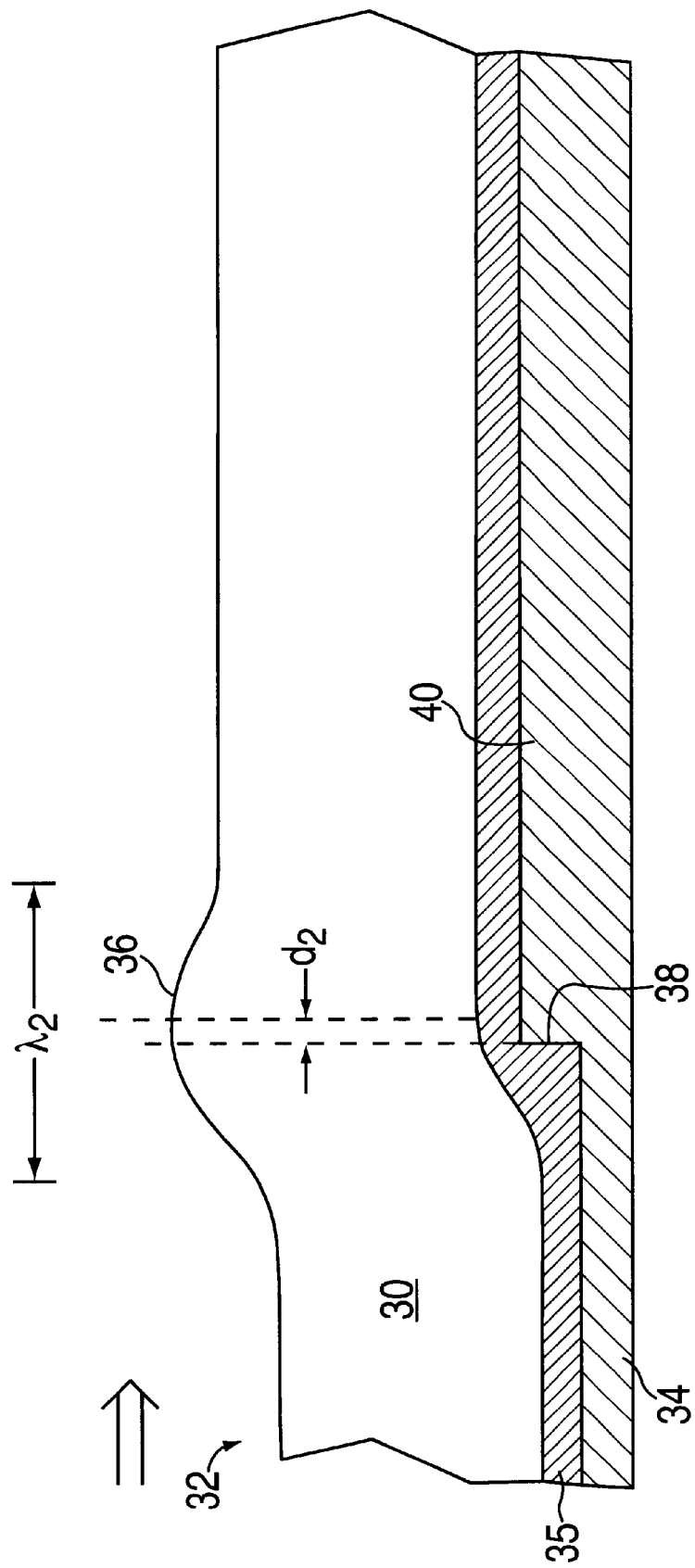
FIG. 4 is cross-sectional view of a dielectric polymer layer applied in accordance with the method in FIG. 3.

FIG. 4 illustrates the results of the application and formation of a dielectric layer in accordance with the above described method. As can be seen, the quicker drying SiLK® polymer 30, coupled with a reduction in overall high-speed spin duration, causes a significant decrease in the stretching of the polymer wave 36, with the wave 36 having a reduced wavelength $\lambda_2$ of about 20–50 µm. Additionally, it can be seen that there is a minimal displacement $d_2$ of the peak of the wave 36 from step height 38. In turn, this improves the overall planarity of the dielectric film 30. Furthermore, as is apparent, the amplitude of the polymer wave 36 has been significantly reduced as a result of a thicker promoter layer 35. However, the overall thickness of promoter layer 35 is not so large as to have a detrimental impact upon other process integration steps. Rather, promoter layer 35 provides a smoother transition for the polymer layer 30 as it ascends step height 38 to cover layer 40 during spin-on.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a planarized dielectric layer upon a semiconductor wafer, the method comprising:

applying an adhesion promoter to the wafer, thereby forming an adhesion promoter layer;

applying a dielectric material in a spin-on fashion upon said adhesion promoter layer at a relative humidity of less tan 40% and for a thickness setting duration of about 12 to about 16 seconds; and drying said dielectric material by baking thereof without additional spinning of the semiconductor wafer.

2. The method of claim 1, wherein said dielectric material comprises an organic polymer.

3. The method of claim 2, wherein said dielectric material has a dielectric constant of less than 3.0.

4. The method of claim 1, further comprising:

following drying said dielectric material, removing any dielectric edge beads formed upon the semiconductor wafer by applying a solvent thereto.

5. The method of claim 4, further comprising:

following removing said any dielectric edge beads, curing said dielectric material.

6. The method of claim 5, wherein said dielectric material is cured by baking at about 400° C.

7. The method of claim 1, further comprising:

prior to applying said dielectric material, curing said adhesion promoter layer.

8. The method of claim 7, wherein said adhesion promoter layer is cured by baking at about 185° C.

9. The method of claim 1, wherein said dielectric material is applied at a relative humidity of less than 35%.

10. A planarized dielectric layer for a semiconductor wafer, the dielectric layer comprising:

an adhesion promoter layer applied to the wafer; and a dielectric material, applied in a spin-on fashion upon said adhesion promoter layer at a relative humidity of less than 40% and for a thickness setting duration of about 12 to about 16 seconds;

wherein said dielectric material is dried by baking thereof without additional spinning of the semiconductor wafer.

11. The dielectric layer of claim 10, wherein said dielectric material is applied at a relative humidity of less than 35%.

12. The dielectric layer of claim 10, wherein said dielectric material comprises an organic polymer.

13. The dielectric layer of claim 12, wherein said dielectric material has a dielectric constant of less than 3.0.

14. The dielectric layer of claim 10, wherein:

any dielectric edge beads formed upon the semiconductor wafer are removed by applying a solvent thereto.

15. The dielectric layer of claim 14, wherein said dielectric material is cured.

16. The dielectric layer of claim 15, wherein said dielectric material is cured by baking at about 400° C.

17. The dielectric layer of claim 10, wherein said adhesion promoter layer is cured prior to the application of said dielectric material.

18. The dielectric layer of claim 17, wherein said adhesion promoter layer is cured by baking at about 185° C.

* * * * *